(12) United States Patent
Purkayastha et al.

(10) Patent No.: US 8,748,726 B2
(45) Date of Patent: Jun. 10, 2014

(54) SYNTHESIS OF SILVER, ANTIMONY, AND TIN DOPED BISMUTH TELLURIDE NANOPARTICLES AND BULK BISMUTH TELLURIDE TO FORM BISMUTH TELLURIDE COMPOSITES

(75) Inventors: Arup Purkayastha, Bangalore (IN); Purushottam Joshi, Bangalore (IN)

(73) Assignee: Laird Technologies, Inc., Earth City, MO (US)

( * ) Notice: Subject to any disclaimer, the term of this patent is extended or adjusted under 35 U.S.C. 154(b) by 181 days.

(21) Appl. No.: 13/398,274

(22) Filed: Feb. 16, 2012

(65) Prior Publication Data

US 2012/0145212 A1    Jun. 14, 2012

Related U.S. Application Data

(63) Continuation of application No. PCT/US2010/043847, filed on Jul. 30, 2010.

(30) Foreign Application Priority Data

Aug. 17, 2009    (IN) .......................... 1888/MUM/2009

(51) Int. Cl.
*H01L 35/22* (2006.01)
*H01L 39/12* (2006.01)
*H01L 35/34* (2006.01)
*B82Y 40/00* (2011.01)

(52) U.S. Cl.
USPC ........... 136/224; 136/201; 136/238; 136/240; 252/514; 252/519.14

(58) Field of Classification Search
CPC ......... H01L 35/28; H01L 35/32; H01L 35/34; H01L 31/022425; H01L 39/12; C10B 19/04; H01B 1/00; H01B 1/02; H01B 13/00; B82Y 40/00; B82Y 30/00; G03F 7/0002

USPC .......... 136/205, 224, 238, 240, 201; 252/514, 252/519.14

See application file for complete search history.

(56) References Cited

U.S. PATENT DOCUMENTS

| 7,098,393 B2 | 8/2006 | Fleurial et al. |
| 2008/0087314 A1 | 4/2008 | Xiao et al. |
| 2009/0205695 A1* | 8/2009 | Makansi ....................... 136/201 |

FOREIGN PATENT DOCUMENTS

| CN | 1546369 | 11/2004 |
| JP | 2007-281070 | 10/2007 |

(Continued)

OTHER PUBLICATIONS

Yang et al. ("Thermoelectric properties of silver-doped n-type Bi2Te3-based material prepared by mechanical alloying and subsequent hot pressing") Journal of Alloys and Compounds 407 (2006) 330-333.*

(Continued)

*Primary Examiner* — Susan D Leong
(74) *Attorney, Agent, or Firm* — Harness, Dickey & Pierce, PLC

(57) ABSTRACT

According to various aspects, exemplary embodiments are provided of thermoelectric materials, which embodiments may have improved figure of merit. In one exemplary embodiment, a thermoelectric material generally includes bismuth telluride nanoparticles, which may be undoped or doped with at least one or more of silver, antimony, tin, and/or a combination thereof. The bismuth telluride nanoparticles may be dispersed in a matrix material comprising particulate bismuth telluride. Methods for making undoped and doped bismuth telluride nanoparticles are also disclosed, which may include a solvothermal method for making bismuth telluride nanoparticles having a size ranging from 1 to 200 nanometers.

19 Claims, 4 Drawing Sheets

(56) References Cited

FOREIGN PATENT DOCUMENTS

Figure 1:
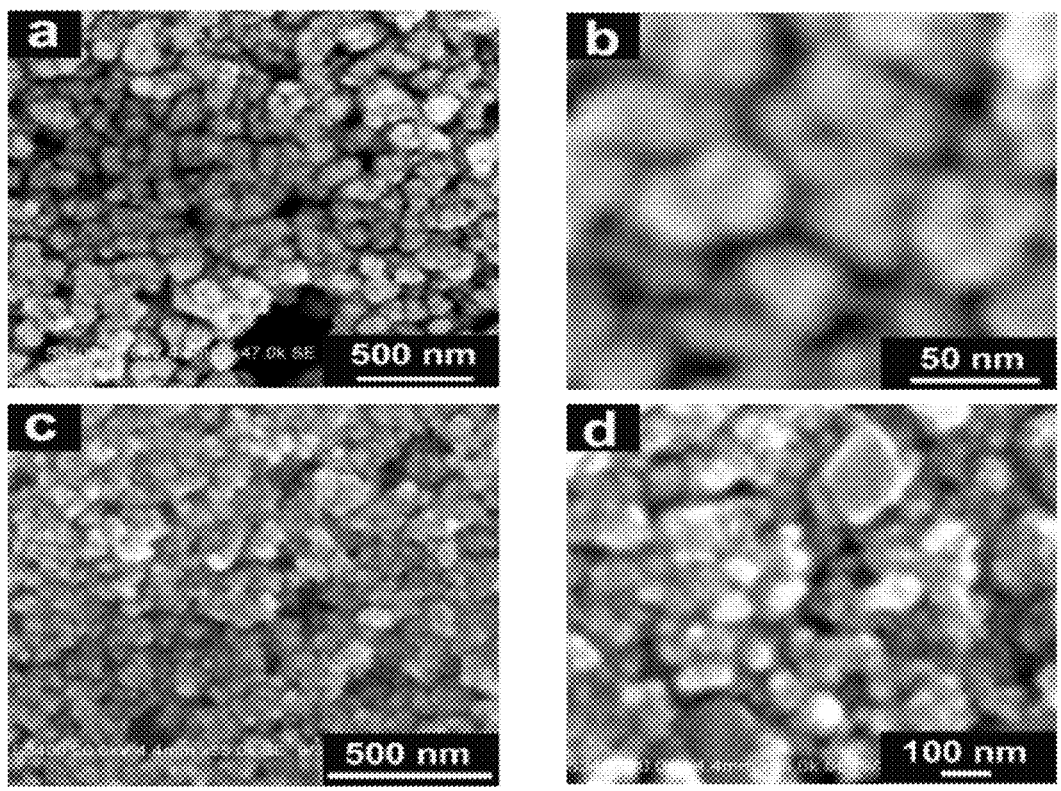

| JP | 2008-147625 | 6/2008 |
| KR | 10-2008-0104455 | 12/2008 |
| WO | WO 2011/022189 | 2/2011 |

OTHER PUBLICATIONS

Examination and Search report dated May 27, 2013 for co-pending Taiwan application No. 099126052 filed Aug. 5, 2010 (published as 201118041 on Jun. 1, 2011), 18 pages. The instant application is a continuation of PCT/US2010/043847 (published as WO2011/022189 on Feb. 24, 2011) which, in turn, claims priority to the same India application No. 1888/MUM/2009, filed Aug. 17, 2009, as Taiwan application No. 099126052, filed Aug. 5, 2010.

International Search Report and Written Opinion dated Apr. 28, 2011 for PCT/US2010/043847. The instant application is a continuation of PCT/US2010/043847; 12 pages.

Chen, G. et al, Recent Developments in Thermoelectric Materials, *Int. Mater. Rev.*, Feb. 2003, vol. 48, No. 1; pp. 45-66.

Dresselhaus, M. S. et al, The Promise of Low-Dimensional Thermoelectric Materials, Aug. 20, 1998; *Microscale Thermophys. Eng.*, 1999, 3:89-100.

Chung, Duck-Young et al, $CsBi_4Te_6$: A High-Performance Thermoelectric Material for Low-Temperature Applications, *Science AAAS*, Feb. 11, 2000, vol. 287:5455, pp. 1024-1027.

Kim, BS et al, Thermoelectric Properties of Bi2Te3 Material Doped with Lanthanum by Mechanical Alloying, Oct. 16, 2007; *Synthesis and Reactivity in Inorganic Metal-Organic and Nano-Metal Chemistry*, Mar. 2008, 38, pp. 143-147.

Gothard, N. et al, Thermoelectric and Transport Properties of n-type $Bi_2Te_3$ Nanocomposites, Dec. 15, 2007; *J. Appl. Phys.*, 2008, 103, pp. 054314-1-054314-4.

Fan, X. A. et al, $Bi_2Te_3$ Hexagonal Nanoplates and Thermoelectric Properties of n-type $Bi_2Te_3$ Nanocomposites, Aug. 28, 2007; *J. Phys. D.*, 2007, 40, 5975-5979.

Jiang, Y. et al, Microwave-assisted Preparation of $Bi_2Te_3$ Hollow Nanospheres; Nov. 30, 2006; *Chem. Letters*, 2007, vol. No. 3; 36, 382.

Jiang, Y. et al, $Bi_2Te_3$ nanostructures prepared by microwave heating; May 7, 2007; *J. Cryst. Growth*, 2007, 306, 351-355.

Purkayastha, A. et al, Molecularly Protected Bismuth Telluride Nanoparticles: Microemulsion Synthesis and Thermoelectric Transport Properties, *Adv. Mater.*, 2006, 18, 2958-2963.

Foos, E. E. et al, Synthesis and Characterization of Nanocrystalline Bismuth Telluride, Oct. 5, 2001; *Nano Letters*, vol. 1; No. 12; pp. 693-695.

Ritter, J. J., A Novel Synthesis of Polycrystalline Bismuth Telluride; *Inorg. Chem.* Jun. 23, 1994, vol. 33, No. 26; 6419-6420.

Ritter, J. J.; et al., Synthesis of Polycrystalline Bismuth Telluride by a Metal-Organo Complex Method; *Inorg. Chem.*, 1995, vol. 34, No. 16; pp. 4278-4280.

\* cited by examiner

SYNTHESIS OF SILVER, ANTIMONY, AND TIN DOPED BISMUTH TELLURIDE NANOPARTICLES AND BULK BISMUTH TELLURIDE TO FORM BISMUTH TELLURIDE COMPOSITES

CROSS-REFERENCE TO RELATED APPLICATION

This application is a continuation of International Patent Application No. PCT/US2010/043847 filed Jul. 30, 2010 (and published as WO 2011/022189 on Feb. 24, 2011), which, in turn claims priority to India Patent Application No. 1888/MUM/2009 filed Aug. 17, 2009. The entire disclosure of the above applications is incorporated herein by reference.

FIELD

The present disclosure relates to doped bismuth telluride nanoparticles, composites of doped bismuth telluride nanoparticles in bismuth telluride, and methods for their production.

BACKGROUND

This section provides background information related to the present disclosure which is not necessarily prior art.

Thermoelectric materials are known to convert thermal energy directly into electrical energy or vice versa. The efficiency of a thermoelectric material is typically characterized by the thermoelectric figure of merit, (Z) which is defined as the square of its Seebeck coefficient times its electrical conductivity a (sigma) divided by its thermal conductivity κ (kappa) or $Z=S^2\sigma/\kappa$ (Equation 1). The Seebeck coefficient is a measure of the "thermoelectric pumping power", which is the amount of heat that a material can pump per unit of electrical current. The electrical conductivity is a measure of electrical losses in a material, and the thermal conductivity is a measure of heat that is lost as it flows back against the heat pumped by a material. The figure of merit Z depends on the macroscopic transport parameters of the materials, thus, a large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_H-T_C)$. Since Z varies with temperature, a useful dimensionless figure-of-merit can be defined as ZT.

SUMMARY

This section provides a general summary of the disclosure, and is not a comprehensive disclosure of its full scope or all of its features.

According to various aspects, exemplary embodiments are provided of thermoelectric materials for power generation or for cooling various electronic devices or other devices. In one exemplary embodiment, a thermoelectric material generally includes bismuth telluride nanoparticles, which may be undoped or they may be doped with at least one or more of silver, antimony, tin, and/or a combination thereof. The nanoparticles may be dispersed in a matrix material comprising particulate bismuth telluride.

In another exemplary embodiment, a thermoelectric device generally includes a first electrical connector and a second electrical connector. A thermoelectric material is in electrical contact with the first electrical connector and the second electrical connector. The thermoelectric material can include doped bismuth telluride nanoparticles or undoped bismuth telluride nanoparticles dispersed in a matrix material having particulate bismuth telluride.

Additional aspects provide methods relating to thermoelectric materials, such as methods of making thermoelectric materials. In one exemplary embodiment, a method for making bismuth telluride nanoparticles for use in a thermoelectric material generally includes mixing a bismuth salt with a long-chain alkane hydrocarbon forming a bismuth salt solution; reacting the bismuth salt solution with a long-chain fatty amine forming a bismuth ion solution; adding tellurium to a tertiary alkylphosphine thereby forming a telluride salt solution; adding a surfactant to the bismuth ion solution; and mixing the surfactant containing bismuth ion solution with the telluride salt solution forming a nanoparticle dispersion containing bismuth telluride nanoparticles.

In a further aspect of the present technology, methods are provided for making doped bismuth telluride nanoparticles for inclusion into thermoelectric materials. The method generally includes mixing a bismuth salt with a long-chain alkane hydrocarbon forming a bismuth salt solution; dispersing the bismuth salt solution and a metal salt (e.g., a silver salt, an antimony salt, a tin salt, combinations thereof) in a long-chain fatty amine, thereby forming a doped bismuth salt solution; adding tellurium to a tertiary alkylphosphine, thereby forming a telluride salt solution; adding a surfactant to the doped bismuth salt solution; and mixing the surfactant containing doped bismuth salt solution with the telluride salt solution forming a nanoparticle dispersion containing doped bismuth telluride nanoparticles.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 generally depicts scanning electron micrographs of low and high magnifications of bismuth telluride nanoparticles (FIGS. 1a and 1b) and antimony doped bismuth nanoparticles (FIGS. 1c and 1d) according to exemplary embodiments of the present technology.

Figure 2:
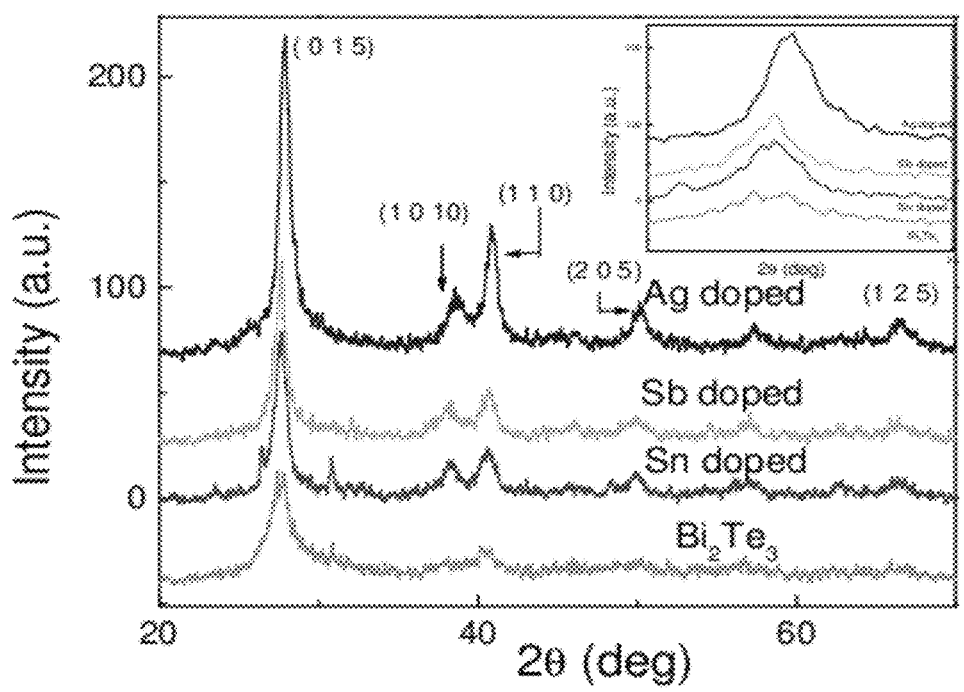

FIG. 2 is a plurality of diffractograms plotted on a graph measuring the intensity in arbitrary units (a.u.) versus twice the angle of diffraction (2θ) in degrees of the various bismuth telluride nanoparticles and doped bismuth telluride nanoparticles. Peaks correspond to Bragg peaks which are indicative of rhombohedral bismuth telluride crystal structure. The inset depicts a graph of shifting X-ray diffractograms of the various bismuth telluride nanoparticles concentrated at the (015) peak position upon doping with antimony, silver, and tin when compared to non-doped bismuth telluride nanoparticles according to exemplary embodiments of the present technology.

Figure 3:
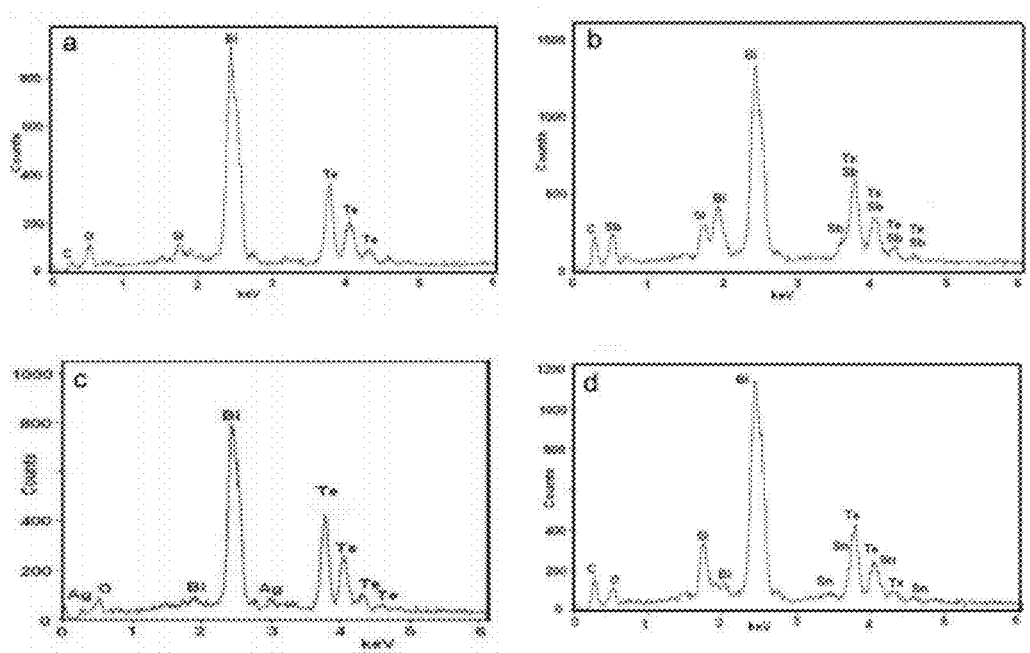

FIG. 3 depicts four energy dispersive X-ray analysis, (EDS) spectra of four samples of bismuth telluride nanoparticles differing in their dopant composition. FIG. 3a depicts the EDS of ($Bi_2Te_3$). FIG. 3b depicts EDS of antimony doped bismuth telluride ($Bi_{2-x}Sb_xTe_3$). FIG. 3c depicts EDS of silver doped bismuth telluride ($Bi_{2-x}Ag_xTe_3$). FIG. 3d depicts EDS of tin doped bismuth telluride ($Bi_{2-x}Sn_xTe_3$) nanoparticles according to exemplary embodiments of the present technology.

Figure 4:
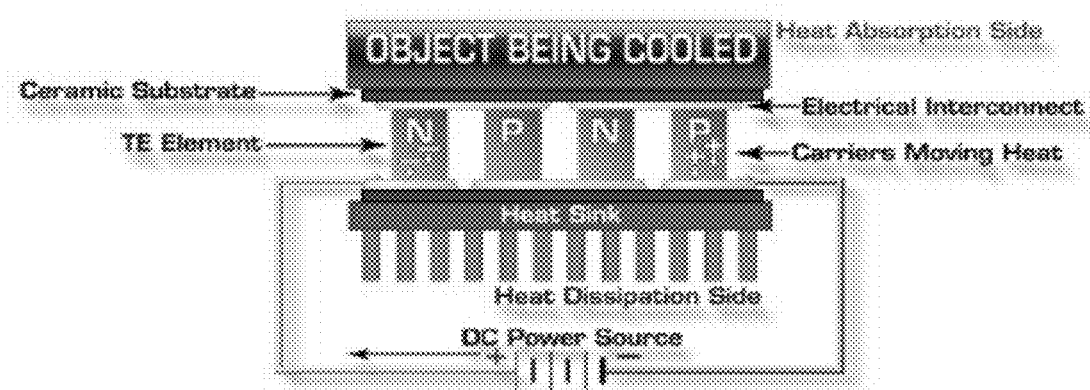

FIG. 4 is a schematic illustration of a thermoelectric cooling device employing thermoelectric materials including doped p-type and n-type bismuth telluride nanoparticles in bulk bismuth telluride material, according to exemplary embodiments of the present technology.

DETAILED DESCRIPTION

Example embodiments will now be described more fully with reference to the accompanying drawings.

The following description of technology is merely exemplary in nature of the subject matter, manufacture, and use of one or more inventions and embodiments thereof, and is not intended to limit the scope, application, or uses of any specific invention claimed in this application or in such other applications as may be filed claiming priority to this application, or patents issuing therefrom. The following definitions and non-limiting guidelines must be considered in reviewing the description of the technology set forth herein.

The headings (such as "Background" and "Summary") and sub-headings used herein are intended only for general organization of topics within the present technology, and are not intended to limit the disclosure of the present technology or any aspect thereof. In particular, subject matter disclosed in the "Background" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

The citation of references herein does not constitute an admission that those references are prior art or have any relevance to the patentability of the technology disclosed herein. Any discussion of the content of references cited in the Background is intended merely to provide a general summary of assertions made by the authors of the references, and does not constitute an admission as to the accuracy of the content of such references. All references cited in the "Description" section of this specification are hereby incorporated by reference in their entirety.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

As used herein, the words "preferred" and "preferably" refer to embodiments of the technology that afford certain benefits, under certain circumstances. But other embodiments may also be preferred, under the same or other circumstances. Furthermore, the recitation of one or more preferred embodiments does not imply that other embodiments are not useful, and is not intended to exclude other embodiments from the scope of the technology.

As referred to herein, all compositional percentages are by weight of the total composition, unless otherwise specified. As used herein, the word "comprise", "include," and variants thereof are intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting ingredients, components or process steps, Applicants specifically envision embodiments consisting of, or consisting essentially of, such ingredients, components or processes excluding additional ingredients, components or processes (for consisting of) and excluding additional ingredients, components or processes affecting the novel properties of the embodiment (for consisting essentially of), even though such additional ingredients, components or processes are not explicitly recited in this application. For example, recitation of a composition or process reciting elements A, B, and C specifically envisions embodiments consisting of, and consisting essentially of, A, B, and C, excluding an element D that may be recited in the art, even though element D is not explicitly described as being excluded herein.

Exemplary thermoelectric composite materials of the present technology include bismuth telluride nanoparticles in the form of undoped bismuth telluride nanoparticles also referred to herein as simply bismuth telluride nanoparticles or bismuth telluride nanoparticles doped with at least one or more of silver, antimony, tin, and/or combinations thereof. The doped or undoped bismuth nanoparticles may be dispersed in a matrix material comprising particulate bismuth telluride. In other examples of the present technology, a thermoelectric device is provided having doped bismuth telluride nanoparticles in a matrix material of bulk particulate bismuth telluride.

Doped Bismuth Telluride Nanoparticles

An example of a thermoelectric material applicable to thermoelectric cooler (TEC) technology according to the present technology includes doped bismuth telluride nanoparticles. Bismuth telluride ($Bi_2Te_3$) containing nanoparticles can contain one or more doping metals selected from antimony, silver, tin, and/or combinations thereof. In various embodiments, the nanoparticles of doped bismuth telluride can contain about 35 to 49 by atomic percent of bismuth, and 40 to 65 by atomic percent of tellurium, preferably ranging from 43 to 46 atomic percent of bismuth and 45 to 51 atomic percent of tellurium. In other exemplary embodiments, the doped bismuth telluride nanoparticles can have an atomic weight percent ratio of bismuth to tellurium that ranges from 0.43:1 to about 1:1. In some embodiments, the doped bismuth telluride nanoparticles can also contain impurities, including carbon and oxygen. The amount of impurities including carbon and/or oxygen can range from about 0.0001% to about 0.5% by atomic weight of the nanoparticle composition in some embodiments.

The doped bismuth telluride nanoparticles of the present technology are in the nano scale range. As used herein, nanoparticles generally refer to particles that have a maximum dimension less than 200 nanometers, and accordingly would thus include particles having a maximum dimension less than 150 nanometers, particles having a dimension less than 100 nanometers. Some preferred embodiments include nanoparticles where at least 50% of the nanoparticles range in size with a maximum dimension ranging from about 1 nanometers to about 150 nanometers in size, preferably ranging from about 10 nanometers to about 150 nanometers. Illustrative methods for the synthesis of antimony-doped, silver-doped, and/or tin-doped bismuth telluride nanoparticles are provided herein below.

Thermoelectric Composite Materials of Doped or Undoped Bismuth Telluride Nanoparticles in a Matrix of Particulate Bismuth Telluride The present technology further advances the field of thermoelectric materials by providing thermoelectric materials composed of nanoparticles of bismuth telluride or doped bismuth nanoparticles and a matrix of particulate bismuth telluride. When referring to the thermoelectric materials, nanoparticles of bismuth telluride can include undoped bismuth telluride nanoparticles or doped bismuth telluride nanoparticles, wherein the doped bismuth telluride nanoparticles can include one or more of antimony doped bismuth telluride nanoparticles, silver doped bismuth telluride nanoparticles, and tin doped bismuth telluride nanoparticles as described above. The bismuth telluride nanoparticles or doped bismuth telluride nanoparticles can be dispersed in a bulk matrix material composed essentially of particulate bismuth telluride.

In some examples, a thermoelectric material can include doped or undoped bismuth telluride nanoparticles in an amount ranging from 15% to about 30% by weight percent of the final composition dispersed in about 70% to about 85% bulk bismuth telluride by weight of the final composition. By way of example, doped bismuth telluride nanoparticles may be mixed into a bulk bismuth telluride matrix and then the composition may be made into pellets. In this example, the final composition range of doped bismuth telluride nanoparticles during the mixing and in the pellets may be about the same (e.g., an amount ranging from about 15% to about 30% by weight percent of the mixed or final composition). In another example, undoped bismuth telluride nanoparticles may be mixed into a bulk bismuth telluride matrix and then the composition may be made into pellets. In this example, the final composition range of undoped bismuth telluride nanoparticles during the mixing and in the pellets may be about the same (e.g., an amount ranging from about 15% to about 30% by weight percent of the mixed or final composition).

As discussed previously, the figure of merit, Z, for a thermoelectric material can be defined as $Z=S^2\sigma/\kappa$, in terms of Seebeck coefficient (S), electrical conductivity ($\sigma$), and thermal conductivity ($\kappa$). Hence, a good thermoelectric material may have large values of S and $\sigma$, and/or low values of $\kappa$. High thermoelectric figures of merit (ZT>1) can be provided by the composite thermoelectric materials provided herein. The quantum size effect tunes the electronic and thermal properties and increases thermoelectric efficiency. But preparation of quantum wires, quantum dots, superlattice structures, and the like using conventional semiconductor device processing. techniques require expensive fabrication techniques and equipment. In addition, these approaches conventionally provide only thin films of thermoelectric material. As disclosed herein, the present technology may provide composite thermoelectric materials comprising bismuth telluride particles dispersed in bulk bismuth telluride having an improvement in ZT made possible by increasing electrical conductivity and decreasing thermal conductivity. By introducing composite material pellets of bismuth telluride nanoparticles or doped bismuth telluride nanoparticles and bulk bismuth telluride matrix, ZT can be improved to 1.0 to 1.2. A similar or same range of improvement of ZT may also be realized when using undoped bismuth telluride nanoparticles.

Without wishing to be bound to any particular theory, it is believed that the quantum size effect has two types of influences: (1) the confined dimensions can modify the electronic band structure and phonon dispersion relationship, resulting in discrete electronic density of states and reduced phonon group velocity (confinement effect); and (2) the high surface area and (sometimes) interface area present in the bismuth telluride nanoparticles introduces more boundary scatterings for both electrons and phonons (surface effect). One or both of these effects may be significant in materials according to the present invention.

Methods for Making Bismuth Telluride Nanoparticles

A description will now be provided of various exemplary methods for making, producing, or synthesizing nanoparticles of bismuth telluride having an enhanced figure of merit (ZT) greater than 1. These examples are provided for purposes of illustration, as other methods, materials, and/or configurations may also be used. In one aspect of the various embodiments, a method for forming nanoparticles of bismuth telluride is provided. In this example, the method or process for synthesizing a thermoelectric bismuth telluride nanoparticle material may include the following steps, operations, or processes: mixing a bismuth salt with a long-chain alkane hydrocarbon forming a bismuth salt solution; reacting the bismuth salt solution with a long-chain fatty amine forming a bismuth ion solution; adding tellurium to a tertiary alkylphosphine, thereby forming a telluride salt solution; adding a surfactant to the bismuth ion solution; and mixing the surfactant containing bismuth ion solution with the telluride salt solution forming a nanoparticle dispersion containing bismuth telluride nanoparticles. Optionally, the method may also include further isolating the nanoparticles of bismuth telluride from the nanoparticle dispersion by removing the surfactant by centrifuging the nanoparticle dispersion in a biphasic solvent, for example, hexane/isopropyl alcohol.

The exemplary synthesis steps described above can also include at least one of incubation and/or refluxing for at least 10 minutes at a temperature ranging from 150° C. to about 170° C. after each addition or mixing step.

The bismuth used in making the nanoparticles, can be obtained as a bismuth precursor, for example, a bismuth salt (e.g., bismuth acetate, etc.). The bismuth precursor can be dissolved in a solvent, for example a long-chain organic thereby forming bismuth salt solution. In some embodiments, the long-chain organic solvent can include a long-chain alkane having the formula $C_nH_{2n+2}$. In some embodiments, the alkane can include, but not limited to, dodecane. The bismuth salt solution can then be heated to a temperature falling within a range from about 150° C. to about 170° C. and then admixed with a long-chain fatty amine forming a bismuth ion solution. Illustrative examples of long-chain fatty amines can include oleylamine, which may also be referred to as 9-octadecen-1-amine and/or by its IUPAC name (Z)-octadec-9-en-1-amine In some embodiments, 0.01 to 0.02 millimoles of the long-chain fatty amine or the amount of the long-chain fatty amine added can range from 10% to about 20% of the total weight percentage of whole reaction mixture of the final composition. The tellurium component of the bismuth telluride nanoparticles can be prepared separately prior to admixture with the bismuth ion solution. In various embodiments, tellurium powder can be admixed at elevated temperatures, for example, at a temperature ranging from about 150° C. to about 170° C. with a tertiary alkylphosphine to form a tellurium salt solution. When the bismuth ion solution and the tellurium salt solution are ready to be mixed, a surfactant can be added to the bismuth ion solution prior to mixing. Upon admixture of the bismuth ion solution and the tellurium salt solution, the mixture can be refluxed at a temperature ranging from about 150° C. to about 170° C. for a period of time sufficient to form the nanoparticles containing bismuth telluride. Optionally, the nanoparticles can be further isolated by centrifuging the nanoparticles in an appropriate biphasic solvent. In some embodiments, the biphasic solvent can include hexane-isopropanol. The nanoparticles thus produced can comprise bismuth:tellurium in an atomic ratio of 37-39%:61-63%. The nanoparticles of bismuth telluride can have an atomic weight percent ratio of bismuth to telluride that ranges from 0.43:1 to about 1:1.

Methods for Making Doped Bismuth Telluride Nanoparticles

Exemplary methods for making metal doped bismuth telluride nanoparticles include the following illustrative steps, operations, or processes: mixing a bismuth salt with a long-chain alkane hydrocarbon forming a bismuth salt solution; dispersing the bismuth salt solution and a metal salt (e.g., a silver salt, an antimony salt, a tin salt, combinations thereof) in a long-chain fatty amine, thereby forming a doped bismuth salt solution; adding tellurium to a tertiary alkylphosphine, thereby forming a telluride salt solution; adding a surfactant to the doped bismuth salt solution; and mixing the surfactant containing doped bismuth salt solution with the telluride salt solution forming a nanoparticle dispersion containing doped bismuth telluride nanoparticles. Optionally, the method can include further isolating the nanoparticles of doped bismuth telluride from the nanoparticle dispersion by removing the surfactant by centrifuging the nanoparticle dispersion in a biphasic solvent.

The doped bismuth telluride nanoparticles results in the formation of $Bi_{2-x}Ag_xTe_3$, $Bi_{2-x}Sb_xTe_3$, $Bi_{2-x}Sn_xTe_3$, and the like. In some preferred embodiments, the dopant concentration may be between 4% to 10% and ratio of dopant (metal) to bismuth may vary from 1:4 to 1:11. Dopant antimony and dopant tin may each act as an acceptor impurity thus doping bismuth telluride with antimony or tin results in p-type bismuth telluride. Bismuth telluride doped with silver may result either n-type or p-type bismuth telluride depending on whether dopant silver atom is going to the interstitial site or is replacing bismuth from the bismuth site in the lattice site. By way of example, the doped bismuth telluride nanoparticles may include one or more of p-type doped bismuth telluride nanoparticles comprising $Bi_{2-x}Sb_xTe_3$, p-type doped bismuth telluride nanoparticles comprising $Bi_{2-x}Sn_xTe_3$, p-type doped bismuth telluride nanoparticles comprising $Bi_{2-x}Ag_xTe_3$ with Ag in lattice sites, and n-type doped bismuth telluride nanoparticles comprising $Bi_{2-x}Ag_xTe_3$ with Ag in interstitial sites.

In some embodiments, one or more of the reaction steps, for example the mixing and adding steps, can be performed at elevated temperatures, for example, at a temperature falling within a range from about 150° C. to about 170° C.

The method for forming doped bismuth telluride nanoparticles differs from the method of forming bismuth telluride particles in that one or more metal salts comprising of antimony, silver, and/or tin can be added to the bismuth salt solution. The metal salt of antimony, silver, and/or tin can include the one or more metals in an acetate salt, a nitrate salt, a chloride salt, an oxide, and a fluoride.

Illustrative compositional analyses of doped bismuth telluride nanoparticles produced using exemplary methods of the present technology are provided in Table 1 below.

TABLE 1

Composition analysis by energy dispersive X-ray analysis, (EDS) for bismuth telluride and doped bismuth telluride nanoparticles.

| Alloy | Element (atomic wt %) | | Doped element (atomic wt %) | | |
|---|---|---|---|---|---|
| | Bi | Te | Sb | Ag | Sn |
| $Bi_2Te_3$ | 38 | 62 | 0 | 0 | 0 |
| $Bi_{2-x}Sb_xTe_3$ | 43.85 | 45.95 | 10.2 | 0 | 0 |
| $Bi_{2-x}Ag_xTe_3$ | 46 | 50 | 0 | 4 | 0 |
| $Bi_{2-x}Sn_xTe_3$ | 45 | 50.2 | 0 | 0 | 4.8 |

Methods for Making Bulk Bismuth Telluride

In various examples of the present technology, nanoparticles can be mixed, dispersed or embedded in a matrix of bulk bismuth telluride. The bulk bismuth telluride can include bismuth telluride in the form of a fine powder having a maximum dimension ranging from 1 micrometer to about 50 micrometers, a precipitate, a paste comprising a compatible carrier, in pellets, and other particulate forms. In various embodiments, the bulk bismuth telluride may have a size of a few micrometers or less. In other illustrative examples of the present technology, a method for producing a matrix of bulk bismuth telluride can include the steps, operations, or processes: dissolving a bismuth precursor in an acid to form a bismuth salt solution; mixing telluric acid dissolved in an organic diol with the bismuth salt solution, thereby forming a reaction mixture; reacting a basic amine with the reaction mixture; and precipitating the particulate bismuth telluride from the reaction mixture with a reducing agent.

The process may further include mixing a bismuth precursor, for example, bismuth chloride, although any form of pure bismuth and/or bismuth salts can be used, including bismuth pentafluoride, bismuth subnitrate, bismuth subcarbonate, and bismuth acetate. By way of example, bismuth is relatively inert in aqueous solutions, but bismuth can be readily dissolved in an acid, for example, nitric acid. Telluric acid can be dissolved in a solution of an organic diol. The organic diol can be added to the telluric acid at an elevated temperature, for example, greater than 60° C. The organic diol can include ethylene glycol or a chemically similar diol. The acid dissolved bismuth may then be added to the telluric acid solution forming a reaction mixture. The reaction mixture may then be reacted with a solution of ethylene diamine and then refluxed at 100° C. In some embodiments, the solution of ethylene diamine can be a 50% solution of ethylene diamine, the balance with water. The bismuth telluride can then be precipitated from solution by the addition of an organic reducing solution. In some embodiments, the organic reducing solution can include reducing agents such as alcohols, sugars, carboxylic acids or aldehydes, for example, an alcohol, for example polyethylene glycol, a reducing sugar, for example a glucose, a carboxylic acid, for example, L-ascorbic acid, L-ascorbate, D-erythorbic acid, and D-erythorbate. In some illustrative examples, the reducing solution is hydrazine hydrate. After the addition of the reducing solution, a black precipitate of bismuth telluride is produced. Optionally, the bismuth telluride can be further isolated by filtration, centrifugation, and other physical methods for isolating particles having a size ranging from about 1, about 10, or about 20 nanometers to about 150 nanometers.

Method for Making Thermoelectric Materials and Devices Incorporating Undoped or Doped Nanoparticles of Bismuth Telluride Undoped or doped bismuth telluride nanoparticles are produced using the methods provided herein. In an exemplary embodiment, the method can include treating bismuth telluride nanoparticles or doped bismuth telluride particles with a hydrazine solution; mixing particulate bismuth telluride with either the treated bismuth telluride nanoparticles or treated doped bismuth telluride nanoparticles in an aqueous solution, thereby forming a thermoelectric material precursor; stirring the thermoelectric material precursor for 2-3 hours to form a homogenized thermoelectric material; centrifuging the homogenized thermoelectric material forming a powder composite material; and pressing the powder composite material using a consolidation or pressure process, for example, a carver press, to form the thermoelectric material.

In an exemplary method of the present technology, an amount of doped bismuth telluride nanoparticles (a first component which includes any one or more of antimony doped bismuth telluride nanoparticles, silver doped bismuth telluride nanoparticles, and tin doped bismuth telluride nanoparticles) are mixed with and/or dispersed with bulk bismuth telluride matrix material (a second component). In some illustrative examples, a thermoelectric composite material may instead include undoped bismuth telluride nanoparticles in place of the doped bismuth telluride nanoparticles. Illustrative methods for the manufacture of undoped bismuth telluride nanoparticles are provided herein.

In some exemplary embodiments, an amount of undoped or doped bismuth telluride nanoparticles ranging from about 15 weight percent to about 30 weight percent can be dispersed in the bulk matrix of bismuth telluride. The first and second components, each individually or both, can be in the form of a powder, a liquid dispersion, a paste, a gel, and combinations thereof. In some examples, powders can also include a particulate material, including one or more types of particles, nanoparticles, and the like. The doped bismuth telluride nanoparticles and bulk bismuth telluride matrix can then be intimately mixed. By way of example, the doped bismuth telluride (or undoped bismuth telluride in other embodiments) may be mixed with bulk bismuth telluride in a suitable solvent and stirred continuously for about 2 to 3 hours for thorough mixing. In other exemplary compositions, the powdered doped bismuth telluride nanoparticles can be admixed or dispersed in a bulk bismuth telluride paste or powder and homogenized to form the composite material. The composite material can be subsequently dried to a fine powder. Finally, the homogenized dried powder can be fabricated or compacted into one or more pellets using a press, for example, a carver press.

In other illustrative examples, doped bismuth telluride nanoparticles and bulk bismuth telluride matrix can be combined for mixing wherein the doped bismuth telluride are in the form of nanoparticles during the mixing process, and the bulk bismuth telluride matrix can be in the form of crystals/powder. Mixing of the doped bismuth telluride nanoparticles and bulk bismuth telluride matrix can take place dry, or in a liquid, gel, or other medium. A thermal and/or vacuum step can be used to remove fluid components during or after mixing.

After mixing, the mixture can be subjected to a consolidation process, which consolidates the nanoparticles and/or loose powder into a monolithic form. The consolidation process may include application of pressure, temperature, and/or radiation to the mixture. Consolidation processes can include hot isostatic pressing (HIP), hot uniaxial pressing, hot pressing, cold isostatic pressing, other pressing techniques, laser irradiation (e.g., laser sintering, etc.), microwave irradiation, irradiation by other electromagnetic radiation, ultrasound irradiation, shock compression or sintering, melting of one or more components (including softening or surface melting), electric field sintering, plasma sintering, or other technique or combination of techniques.

By way of background, melting the constituent elements bismuth and tellurium in evacuated and sealed quartz tube above 600° C., which results in the formation of bismuth telluride. Similarly, melting bismuth and tellurium either with any of the dopant elements (e.g., tin, silver, antimony) can result in doped bismuth telluride. But bismuth telluride or doped bismuth telluride formed by this melting method tend to be very big in grain size (several hundred micrometers). Thus, this melting technique is not particularly well suited for producing nanoscale bismuth telluride and doped bismuth telluride. Mechanical alloying of bismuth and telluride powder may be employed to provide bulk bismuth telluride. Electrodeposition from dissolved salt solution of bismuth telluride into the porous inorganic channel may result in formation of bismuth telluride nanowires. Electrodeposition may also be extended for the synthesis of $Bi_{2-x}Sb_xTe_3$ nanowires. By way of comparison, the present disclosure includes embodiments in which a chemical route, for the first time, is used for the synthesis of antimony doped bismuth telluride nanoparticles, tin doped bismuth telluride nanoparticles, and silver doped bismuth telluride nanoparticles.

Uses of Thermoelectric Materials having Doped Nanoparticles of Bismuth Telluride in Bulk Bismuth Telluride Applications of thermoelectric materials and devices according to the present technology will be clear to those skilled in the art. Illustrative applications can include, but not limited to, cooling of various electrical and non-electrical devices through the Peltier effect. In exemplary applications, the present thermoelectric composite materials can be incorporated into applications such as cooling (such as cooling of electronic components and other devices), food and beverage refrigeration, atmospheric conditioning such as air conditioning and dehumidifiers, personal cooling devices carried by individuals in hot climates, respiration gas conditioning, and the like. Thermoelectric composites of the present technology can also be successfully integrated into electrical power generation in vehicles such as automobiles, airplanes, and spacecraft. A thermal gradient can be provided by operation of an engine, burning combustible fuel, solar energy, or other source of energy, which, in turn, creates a thermal gradient in at least a part of a thermoelectric device connected therewith. Due to the Seebeck effect, the temperature differential of thermoelectric materials can be exploited to generate electromotive force (EMF).

Thermoelectric or thermoelectrical devices of the present technology can be fabricated employing different thermoelectric materials comprising the doped bismuth telluride nanoparticles in bulk bismuth telluride matrix as described herein. A thermoelectric device can essentially be made from alternating p-type and n-type thermoelectric materials connected by metallic interconnects. Semiconductor junctions can be used in power generation devices. Charge flows through the n-type thermoelectric material, crosses a metallic interconnect, and passes into the p-type thermoelectric material. Electrons in the n-type element will move opposite the direction of current, and electron holes in the p-type element will move in the direction of current, both removing heat from at least part of one side of the device and at least part of the thermoelectric material. The heat source will drive electrons in the n-type thermoelectric material toward the cooler region, thus creating a current through the circuit. Electron holes in the p-type thermoelectric material will then flow in the direction of the current. The current can then be used to power a load, thus converting the thermal energy into electrical energy.

In some of the illustrative applications, for example, where the use of an engine provides a heat source, a thermoelectric device of the present technology may function as a power generator to facilitate enhanced performance of the engine or vehicle, for example, to charge batteries used in propulsion, heating, cooling, and other electrical functions of the vehicle, device, or component. This augmentation of electrical output captured by the waste heat generated during normal operation provides enormous resource savings and extends the range of operation of the vehicle or device.

Thermoelectric materials and devices contemplated in the present technology can also benefit from the ability to exploit the Peltier effect in thermoelectric applications, for example, cooling (such as cooling of electronic components and devices, food and beverage refrigeration, atmospheric conditioning such as air conditioning and dehumidifiers, personal cooling devices carried by individuals in hot climates, respiration gas conditioning, and the like, and heating applications analogous to those already mentioned (for example, as an air heater in a vehicle, or a de-icer on an airplane). A device may be used for both Peltier and Seebeck effect applications within a vehicle, for example to provide electrical energy from thermal gradients, and for air conditioning. A unitary device may include a Seebeck effect device designed to provide electricity from thermal gradient, and to provide cooling or heating of an air flow to a passenger compartment.

Thermoelectric materials comprising bismuth telluride nanoparticles and/or doped bismuth telluride nanoparticles in a bulk matrix of bismuth telluride prepared using methods according to the present technology can also be used in other applications to prepare articles, such as light-emitting diodes, lasers, optical and infrared detectors, transistors such as field-effect detectors, static electric field detectors, resonant tunneling diodes, photonic bandgap structures, optical waveguides, optical couplers, chemical sensors, and the like.

Embodiments of the present technology provide improved thermoelectric nanocomposites, for example, comprising a matrix of bulk bismuth telluride, and at least one of antimony doped bismuth telluride nanoparticles, silver doped bismuth telluride nanoparticles, and tin doped bismuth telluride nanoparticles with or without bismuth telluride nanoparticles. Particle size of the undoped or doped bismuth telluride nanoparticles can be less than 200 nanometers, such as less than 100 nanometers, less than 50 nanometers and less than 20 nanometers, providing significant quantum confinement effects that lead to a high value of the thermoelectric figure of merit ZT for the nanocomposite. A macroscopically electrically conducting nanostructured semiconductor network comprising bismuth telluride and/or doped bismuth telluride nanoparticles provides connective pathways for charge transport. The nanocomposite material comprising bismuth telluride nanoparticles and/or one or more of antimony doped bismuth telluride nanoparticles, silver doped bismuth telluride nanoparticles, and tin doped bismuth telluride nanoparticles dispersed in bulk bismuth telluride matrix dramatically reduces thermal conductivity of the bulk thermoelectric composite material, due to phonon scattering at interfaces.

Thermoelectric materials of the present technology can be used in a multitude of thermoelectric processes and applications. By way of example, a thermoelectric materials can be used in a thermoelectric cooler, a power generator, or other thermoelectric article or apparatus comprising a thermoelectric material disclosed herein. Some exemplary articles that can be manufactured to incorporate the inventive thermoelectric materials of the present technology can include: a light-emitting diode, a laser, an optical detector, an infrared detector, a field-effect detector, a static electric field detector, a resonant tunneling diode, a photonic bandgap structure, an optical waveguide, an optical coupler and a chemical sensor.

EXAMPLES

Example 1

Synthesis of Bismuth Telluride Nanoparticles

In this first example, bismuth acetate was decomposed with one of either antimony, silver, or tin acetate and trioctyl phosphine-tellurium in the presence of oleyl amine and capping ligand oleic acid at 150° C. to 170° C. This formed either nano bismuth telluride or nano bismuth telluride with antimony dopants, silver dopants, or tin dopants. FIG. 1a and FIG. 1b represent low and high magnification scanning electron microscopy (SEM) images for bismuth telluride ($Bi_2Te_3$), while FIGS. 1c and 1d represent SEM images of antimony doped bismuth telluride nanoparticles. Similar types of morphologies are obtained for the silver doped bismuth telluride nanoparticles and for the tin doped bismuth telluride nanoparticles. X-ray diffraction of nanoparticles sample indicates formation of rhombohedral bismuth telluride phase (FIG. 2). X-ray diffractogram shows a slight shift in the (0 1 5) peak position of bismuth telluride upon doping with antimony, silver, and tin, which shift is more prominent for silver (See inset FIG. 2). The sizes of the nanoparticles prepared by this protocol are very small and fall well within 80 nanometer regime. Energy dispersive X-ray analysis (EDS analysis) of each of the nanoparticle samples shows the presence of respective elements (See Table 1 below and FIGS. 3a, 3b, 3c, and 3d). For example, EDS analysis of a bismuth telluride nanoparticle sample shows the presence of bismuth (Bi=38%) and tellurium (Te=62%) other than carbon (C) and oxygen (O). The presence of carbon and oxygen suggest immobilization of capping ligand oleic acid on the nanoparticles surface.

Example 2

Synthesis of Doped Bismuth Telluride Nanoparticles

In this second example, synthesis of doped bismuth telluride nanoparticles utilizes a solvothermal process method only. 15 milliliters to 25 milliliters of dodecane (reagent grade, from Sigma-Aldrich, Steinheim, Germany) 0.2 millimoles (77.2 milligrams) of bismuth acetate (99.99 metal basis, Sigma-Aldrich, Steinheim, Germany) and 0.04 millimoles (11.95 milligrams) of antimony acetate (99.99 metal basis, Sigma-Aldrich, Steinheim, Germany) was refluxed in a round-bottom flask for 15 minutes at a temperature ranging from 150° C. to 170° C. 3 milliliters to 5 milliliters of oleylamine (technical grade, Sigma-Aldrich, Buchs, Netherland) was added to the bismuth and antimony acetate and refluxed for an additional 15 minutes to 25 minutes at a temperature ranging from 150° C. to 170° C. In a separate vial, 0.3 millimoles (38.1 milligrams) of tellurium powder (99.8 Meta 200 mesh, Sigma-Aldrich, Steinheim, Germany) was dissolved in 17.48 millimoles (8 milliliters) of trioctyl phosphine (TOP) (Technical grade 90%, Sigma-Aldrich, Saint Louis, Mo., Unites States of America) by heating the mixture to a temperature ranging from 150° C. to 170° C. to form soluble Te-trioctyl phosphine solution. 2 milliliters to 4 milliliters of oleic acid (90% Technical grade, Sigma-Aldrich, Bangalore, India) was added to the bismuth and antimony acetate solution prior to mixing the bismuth/antimony and Te-trioctyl phosphine solutions. The whole reaction mixture was refluxed for an additional 15 minutes at 150° C. to 170° C. Excess oleic acid was removed by repeated centrifugation of the antimony doped bismuth telluride nanoparticle containing solution in hexane-isopropanol mixture (10:4 Hexane/Isopropanol mixture, GC grade isopropanol, Merck, Mumbai, India and Laboratory grade hexane, Merck, Mumbai, India). The antimony (Sb) doped bismuth telluride nanoparticles have the chemical formula $Bi_{2-x}Sb_xTe_3$. Following the same protocol described above except replacing antimony acetate with silver or tin acetate resulted in the formation of silver doped bismuth telluride nanoparticles of $Bi_{2-x}Ag_xTe_3$, and tin doped bismuth telluride nanoparticles of $Bi_{2-x}Sn_xTe_3$ respectively.

TABLE 1

Composition analysis by Energy dispersive X-ray analysis, (EDS) for bismuth telluride and doped bismuth telluride nanoparticles.

| Alloy | Element (atomic wt %) | | Doped element (atomic wt %) | | |
|---|---|---|---|---|---|
| | Bi | Te | Sb | Ag | Sn |
| $Bi_2Te_3$ | 38 | 62 | 0 | 0 | 0 |
| $Bi_{2-x}Sb_xTe_3$ | 43.85 | 45.95 | 10.2 | 0 | 0 |
| $Bi_{2-x}Ag_xTe_3$ | 46 | 50 | 0 | 4 | 0 |
| $Bi_{2-x}Sn_xTe_3$ | 45 | 50.2 | 0 | 0 | 4.8 |

As shown in Table 1, exemplary doped and non-doped bismuth telluride nanoparticles can be produced using the methods described herein.

Silver doped bismuth telluride nanoparticles, antimony doped bismuth telluride nanoparticles, and tin doped bismuth telluride nanoparticles produced as described in Example 2 are characterized in FIGS. 3a, 3b, 3c, and 3d showing the X-Ray Diffraction analyses (XRD) on finely powdered bismuth telluride nanoparticles and doped bismuth telluride nanoparticles. In this second example, the nanoparticles of bismuth telluride and doped bismuth telluride are relatively uniform size and distribution. For this second example, the average diameter of bismuth telluride, antimony doped bismuth telluride, silver doped bismuth telluride, and tin doped bismuth telluride nanoparticles are 79.3±2.6, 45.9±0.5, 41.7±1.5, and 74.6±3.2 nanometers, respectively. X-ray Diffraction analysis of bismuth telluride and doped bismuth telluride were performed using a Bruker-D8 advance Diffractometer with Cu $K_\alpha$ radiation and a graphite monochromator. X-ray Diffraction samples were prepared by sprinkling the fine powder of nanoparticles on a glass substrate having some adhesive glue. X-ray diffractograms obtained of the isolated doped and non-doped bismuth telluride nanoparticles depicted in FIG. 2 and the inset therein show characteristic Bragg peaks corresponding to doped and non-doped rhombohedral (trigonal) bismuth telluride crystalline structure. The inset in FIG. 2 shows a shift in the ordering peak (015, 35° 2θ) position upon doping with different dopants. This indicates lattice disordering of bismuth telluride upon doping.

Example 3

Synthesis of a Matrix of Particulate Bismuth Telluride

In this third example, synthesis of bulk or particulate bismuth telluride utilizes a solvothermal process method only. Methods for making particulate bismuth telluride include the steps: adding 9.97 millimoles (3.142 grams) of bismuth chloride (reagent grade, Sigma-Aldrich, Saint Louis, Mo., United States of America) and dissolving the bismuth chloride in 8 milliliters of concentrated (10 to 15 normal) $HNO_3$ (guaranteed grade, Merck, Mumbai, India). In a round bottom flask 14.96 millimoles (3.426 milligrams) of telluric acid (gradepurum, Fluka, Japan) is dissolved in 200 milliliters of hot ethylene glycol (grade-LR, Chemlabs, Bangalore, India) under constant stirring. The telluric acid/ethylene glycol solution was added to the bismuth chloride solution forming a reaction mixture. To this reaction mixture, 5-6 milliliters of ethylene diamine (50% dilution with water) was added drop wise to form a transparent solution. The whole solution was refluxed at 100° C. Adding 20 milliliters of hydrazine hydrate (100%, Merck, Mumbai, India) to the transparent solution just formed results in the formation of black precipitate of bismuth telluride.

The black precipitate of bismuth telluride can be isolated further by any conventional method known in the art. In illustrative techniques, the black precipitate of bismuth telluride can be isolated using an appropriate filter with or without vacuum, by centrifugation/sedimentation, or by drying. In some examples, the bismuth telluride matrix can include dried bismuth telluride precipitate, ground bismuth telluride precipitate, and powdered bismuth telluride precipitate dispersed in a liquid or solid carrier, for example, powdered bulk bismuth telluride can be dispersed in water. Generally, the role of bulk bismuth telluride in composite material is to provide good connectivity network for electrical conductivity. The role of nanoparticles in the composite is to reduce thermal conductivity by interfacial scattering.

Example 4

Synthesis of Bismuth Telluride Thermoelectric Composite Material Containing Nanoparticles of Antimony, Silver or Tin Doped Bismuth Telluride in Bulk Bismuth Telluride Matrix In this fourth example, a thermoelectric composite material of the present technology was prepared by dispersing doped bismuth telluride nanoparticles ranging from about 15% to about 30% (weight percent of the total composite) in a bulk matrix of bismuth telluride. The dispersion was homogenized or intimately mixed using water as carrier solvent. Prior to dispersion, nanoparticles are treated with hydrazine to desorb the capping organic ligand. Finally, the dried homogenized powder was fabricated into a pellet using a carver press. The pellets of thermoelectric composite materials comprising doped bismuth telluride nanoparticles in a bulk matrix of bismuth telluride can be further processed into monolithic thermoelectrical devices as described above using methods exemplified above, such thermoelectric devices having figure of merit (ZT) greater than 1.

In one embodiment of the present example, as shown in FIG. 4, an illustrative application of the present thermoelectric materials can include a thermoelectric cooler employing antimony-doped, tin-doped, or silver-doped bismuth telluride nanoparticles with bulk bismuth telluride. Charge flows through the n-type thermoelectric element comprising bismuth telluride nanoparticles doped with silver (when the silver atom is going to the interstitial site) and crosses a metallic interconnect, and passes into the p-type thermoelectric element. The p-type doped bismuth telluride nanoparticles can comprise antimony and/or tin doped bismuth telluride nanoparticles. When a power source is provided as shown in FIG. 4, the thermoelectric device may act as a cooler. The movement of electrons from the n-type thermoelectric element will be in a direction opposite the direction of current, and the movement of electron holes in the p-type thermoelectric element will be in the direction of current, such that both remove heat from one side of the device. Heat will transfer from the object being cooled to the heat sink and then out through the heat dissipation side. By way of example, the doped bismuth telluride nanoparticles may include one or more of p-type doped bismuth telluride nanoparticles comprising $Bi_{2-x}Sb_xTe_3$, p-type doped bismuth telluride nanoparticles comprising $Bi_{2-x}Sn_xTe_3$, p-type doped bismuth telluride nanoparticles comprising $Bi_{2-x}Ag_xTe_3$ with Ag in lattice sites, and n-type doped bismuth telluride nanoparticles comprising $Bi_{2-x}Ag_xTe_3$ with Ag in interstitial sites.

The foregoing description of various embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A thermoelectric material comprising bismuth telluride nanoparticles, the nanoparticles being dispersed in a matrix material that comprises particulate bismuth telluride, wherein:
   the thermoelectric material comprises a homogenized thermoelectric material having a thermoelectric figure of merit (ZT) of at least 1 or more; and
   the bismuth telluride nanoparticles are doped with at least one or more of silver, antimony, tin, and/or a combination thereof;
   the bismuth telluride nanoparticles have a maximum dimension less than 200 nanometers; and
   the bismuth telluride nanoparticles are present in the thermoelectric material in an amount ranging from more than 20% to about 30% by weight, based on the total weight of the thermoelectric material; and
   the particulate bismuth telluride is present in the thermoelectric material in an amount ranging from 70% to less than 80% by weight, based on the total weight of the thermoelectric material.

2. The thermoelectric material according to claim 1, wherein the bismuth telluride nanoparticles are doped with silver.

3. The thermoelectric material according to claim 1, wherein the bismuth telluride nanoparticles include one or more of:
   p-type doped bismuth telluride nanoparticles comprising $Bi_{2-x}Sb_xTe_3$;
   p-type doped bismuth telluride nanoparticles comprising $Bi_{2-x}Sn_xTe_3$;
   p-type doped bismuth telluride nanoparticles comprising $Bi_{2-x}Ag_xTe_3$ with Ag in lattice sites; and
   n-type doped bismuth telluride nanoparticles comprising $Bi_{2-x}Ag_xTe_3$ with Ag in interstitial sites.

4. The thermoelectric material of claim 1, wherein:
   the thermoelectric material is a metallic doped thermoelectric nanocomposite material in the form of a pellet, a powder, or a dispersion and has a dopant concentration between 4% to 10% and ratio of dopant to bismuth from 1:4 to 1:11;
   the bismuth telluride nanoparticles are present in the thermoelectric material in an amount of 30% by weight, based on the total weight of the thermoelectric material; and
   the particulate bismuth telluride is present in the thermoelectric material in an amount ranging of 70% by weight, based on the total weight of the thermoelectric material.

5. An apparatus comprising the thermoelectric material of claim 1
   wherein the bismuth telluride nanoparticles contain 35 to 49 by atomic percent of bismuth, and 40 to 65 by atomic percent of tellurium, or the bismuth telluride nanoparticles have an atomic weight percent ratio of bismuth to tellurium that ranges from 0.43:1 to 1:1; and
   wherein the apparatus is selected from the group consisting of a light-emitting diode, a laser, an optical detector, an infrared detector, a field-effect detector, a static electric field detector, a resonant tunneling diode, a photonic bandgap structure, an optical waveguide, an optical coupler, and a chemical sensor.

6. A thermoelectric device comprising:
   a first electrical connector and a second electrical connector; and
   the thermoelectric material of claim 1, the thermoelectric material in electrical contact with the first electrical connector and the second electrical connector.

7. The thermoelectric device of claim 6, wherein the bismuth telluride nanoparticles include one or more of:
   p-type doped bismuth telluride nanoparticles comprising $Bi_{2-x}Sb_xTe_3$;
   p-type doped bismuth telluride nanoparticles comprising $Bi_{2-x}Sn_xTe_3$;
   p-type doped bismuth telluride nanoparticles comprising $Bi_{2-x}Ag_xTe_3$ with Ag in lattice sites; and
   n-type doped bismuth telluride nanoparticles comprising $Bi_{2-x}Ag_xTe_3$ with Ag in interstitial sites.

8. A method for making the thermoelectric material of claim 1, the method comprising synthesizing the bismuth telluride nanoparticles, the synthesizing comprising:
   mixing a bismuth salt with a long-chain alkane hydrocarbon forming a bismuth salt solution;
   reacting the bismuth salt solution with a long-chain fatty amine forming a bismuth ion solution;
   adding tellurium to a tertiary alkylphosphine, thereby forming a telluride salt solution;
   adding a surfactant to the bismuth ion solution; and
   mixing the surfactant containing bismuth ion solution with the telluride salt solution forming a nanoparticle dispersion containing bismuth telluride nanoparticles.

9. The method of claim 8, wherein the method is a solvothermal method for synthesizing bismuth telluride nanoparticles.

10. The method of claim 8, further comprising isolating bismuth telluride nanoparticles from the nanoparticle dispersion, wherein isolating includes:
   adding a biphasic solvent to the nanoparticle dispersion;
   centrifuging the nanoparticle dispersion that includes the biphasic solvent; and
   removing sedimented bismuth telluride nanoparticles from the centrifuged nanoparticle dispersion.

11. The method of claim 8, wherein:
   each method step is followed by at least one of incubation and refluxing for at least about 10 minutes at a temperature ranging from about 150° C. to about 170° C.; and/or
   the long-chain fatty amine comprises oleylamine; and/or
   the tertiary alkylphosphine comprises trioctyl phosphine; and/or
   the surfactant comprises oleic acid.

12. A metallic doped thermoelectric nanocomposite material comprising the thermoelectric material of claim 1, wherein the bismuth telluride nanoparticles are doped with at least one or more of silver, antimony, tin, and/or a combination thereof such that the dopant concentration may be between 4% to 10% and ratio of dopant to bismuth may be from 1:4 to 1:11.

13. A method for making the thermoelectric material of claim 1, the method comprising synthesizing the doped bismuth telluride nanoparticles, the synthesizing comprising:
   mixing a bismuth salt with a long-chain alkane hydrocarbon forming a bismuth salt solution;
   dispersing the bismuth salt solution and a metal salt in a long-chain fatty amine thereby forming a doped bismuth salt solution, the metal salt including at least one or more of a silver salt, an antimony salt, a tin salt, and/or a combination thereof;
   adding tellurium to a tertiary alkylphosphine, thereby forming a telluride salt solution;
   adding a surfactant to the doped bismuth salt solution; and
   mixing the surfactant containing doped bismuth salt solution with the telluride salt solution forming a nanoparticle dispersion containing doped bismuth telluride nanoparticles.

14. The method of claim 13, wherein the method is a solvothermal method for synthesizing doped bismuth telluride nanoparticles.

15. The method of claim 13, further comprising isolating doped bismuth telluride nanoparticles from the nanoparticle dispersion, wherein isolating includes:
   adding a biphasic solvent to the nanoparticle dispersion;
   centrifuging the nanoparticle dispersion containing the biphasic solvent; and
   removing sedimented doped bismuth telluride nanoparticles from the centrifuged nanoparticle dispersion.

16. The method of claim 13, wherein:
   each method step is followed by at least one of incubation and refluxing for at least about 10 minutes at a temperature ranging from about 150° C. to about 170° C.; and/or
   the long-chain fatty amine comprises oleylamine; and/or
   the tertiary alkylphosphine comprises trioctyl phosphine; and/or
   the surfactant comprises oleic acid.

17. A method for making the thermoelectric material of claim 1, the method comprising forming the particulate bismuth telluride, the forming comprising:
   dissolving a bismuth precursor in an acid to form a bismuth salt solution;
   mixing telluric acid dissolved in an organic diol with the bismuth salt solution, thereby forming a reaction mixture;
   reacting a basic amine with the reaction mixture; and
   precipitating the particulate bismuth telluride from the reaction mixture with a reducing agent.

18. A method for forming the thermoelectric material of claim 1, the method comprising:
   treating bismuth telluride nanoparticles with a hydrazine solution;
   mixing particulate bismuth telluride with the treated bismuth telluride nanoparticles in an aqueous solution thereby forming a thermoelectric material precursor;
   stirring the thermoelectric material precursor for 2-3 hours to form a homogenized thermoelectric material;
   centrifuging the homogenized thermoelectric material forming a powder composite material; and
   pressing the powder composite material to form the thermoelectric material.

19. The method of claim 18, wherein:
   the bismuth telluride nanoparticles are doped with at least one or more of silver, antimony, tin, and/or a combination thereof, or the bismuth telluride nanoparticles are non-doped bismuth telluride nanoparticles; and/or
   pressing the powder composite material includes using a carver press.

* * * * *